United States Patent
Jeong (10) Patent No.: US 9,324,270 B2
(45) Date of Patent: Apr. 26, 2016

(54) EMISSION DRIVING UNIT FOR ADJUSTING EMISSION SIGNAL, EMISSION DRIVER HAVING THE SAME, AND ORGANIC LIGHT EMITTING DISPLAY DEVICE HAVING THE EMISSION DRIVER

(71) Applicant: Samsung Display Co., Ltd., Gyeonggi-Do (KR)

(72) Inventor: Jin-Tae Jeong, Gyeonggi-Do (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 365 days.

(21) Appl. No.: 13/681,269

(22) Filed: Nov. 19, 2012

(65) Prior Publication Data

US 2013/0222352 A1 Aug. 29, 2013

(30) Foreign Application Priority Data

Feb. 29, 2012 (KR) .................. 10-2012-0021210

(51) Int. Cl.
*G09G 3/30* (2006.01)
*G09G 3/32* (2006.01)
(Continued)

(52) U.S. Cl.
CPC ............ *G09G 3/3266* (2013.01); *G11C 19/184* (2013.01); *G11C 19/28* (2013.01); *G09G 2310/0286* (2013.01)

(58) Field of Classification Search
CPC ...... G09G 3/30; G09G 3/3208; G09G 3/3266
USPC ........................................ 345/76–77, 99, 100
See application file for complete search history.

(56) References Cited

U.S. PATENT DOCUMENTS 8,018,406 B2 9/2011 Chung
8,054,257 B2 11/2011 Kwak et al.
(Continued)

FOREIGN PATENT DOCUMENTS

| CN | 101123069 A | 2/2008 |
| CN | 102148009 A | 8/2011 |

(Continued)

OTHER PUBLICATIONS

Extended European Search Report dated Feb. 1, 2013 for European Patent Application No. EP 12 193 201.6 which shares priority of Korean Patent Application No. KR 10-2012-0021210 with captioned U.S. Appl. No. 13/681,269.

(Continued)

*Primary Examiner* — Roy Rabindranath
(74) *Attorney, Agent, or Firm* — Knobbe Martens Olson & Bear LLP (57) ABSTRACT

In one aspect, an emission driving unit and an organic light emitting diode (OLED) display having the same are disclosed. The emission driving unit includes an input signal generating circuit that receives a FLM signal according to a first clock signal, receives a second clock signal according to the FLM signal, and outputs a sequential input signal. The emission driving unit also includes an inverter circuit that receives the FLM signal according to the first clock signal, and that inverts the FLM signal to generate an inverter output signal. The emission driving unit also includes an output switching circuit that outputs a first voltage having a logic high level or a second voltage having a logic low level as an emission signal in response to the inverter output signal. The input signal generating circuit, the inverter circuit, and the output switching circuit are implemented by transistors of the same kind.

20 Claims, 10 Drawing Sheets

(51) Int. Cl.
*G11C 19/18* (2006.01)
*G11C 19/28* (2006.01)

(56) References Cited

U.S. PATENT DOCUMENTS

| | | | |
|---|---|---|---|
| 8,629,889 | B2 | 1/2014 | Eom |
| 8,803,770 | B2 | 8/2014 | Jeong et al. |
| 2006/0158394 | A1* | 7/2006 | Choi ............... 345/76 |
| 2007/0052653 | A1* | 3/2007 | Shin ............... 345/98 |
| 2007/0103389 | A1 | 5/2007 | Shin |
| 2007/0132701 | A1* | 6/2007 | Jeon ............... 345/100 |
| 2009/0284454 | A1* | 11/2009 | Kwon et al. ...... 345/82 |
| 2010/0013824 | A1* | 1/2010 | Kim et al. ........ 345/214 |
| 2010/0158188 | A1 | 6/2010 | Lee et al. |
| 2010/0188316 | A1 | 7/2010 | Jang |
| 2010/0207968 | A1 | 8/2010 | Kim |
| 2011/0025679 | A1 | 2/2011 | Park |
| 2011/0084947 | A1* | 4/2011 | Chung et al. ...... 345/211 |
| 2011/0102398 | A1 | 5/2011 | Han |
| 2012/0038609 | A1* | 2/2012 | Chung ............. 345/211 |

FOREIGN PATENT DOCUMENTS

| | | |
|---|---|---|
| CN | 102314829 A | 1/2012 |
| EP | 2 474 969 A1 | 7/2012 |
| KR | 10-2008-0022718 (A) | 3/2008 |
| KR | 10-2008-0062458 (A) | 7/2008 |
| KR | 10-2010-0087871 A | 8/2010 |
| KR | 10-2010-0093738 A | 8/2010 |
| KR | 10-2011-0049124 A | 5/2011 |

OTHER PUBLICATIONS

European Examination Report dated Oct. 16, 2013 for European Patent Application No. EP 12 193 201.6 which shares priority of Korean Patent Application No. KR 10-2012-0021210 with captioned U.S. Appl. No. 13/681,269, and cites the above-identified reference numbered 1.

Chinese Office Action dated Jan. 27, 2016 for Chinese Patent Application No. CN 201310038875.6 which shares priority of Korean Patent Application No. KR 10-2012-0021210 with subject U.S. Appl. No. 13/681,269, and cites the above-identified references numbered 5-10.

* cited by examiner

EMISSION DRIVING UNIT FOR ADJUSTING EMISSION SIGNAL, EMISSION DRIVER HAVING THE SAME, AND ORGANIC LIGHT EMITTING DISPLAY DEVICE HAVING THE EMISSION DRIVER

CROSS-REFERENCE TO RELATED APPLICATIONS

This application claims priority under 35 USC §119 to Korean Patent Applications No. 10-2012-0021210, filed on Feb. 29, 2012 in the Korean Intellectual Property Office (KIPO), the contents of which are incorporated herein in its entirety by reference.

BACKGROUND

1. Field

The disclosed technology relates generally to an emission driver. More particularly, the technology relates to an emission driver implemented with N-type transistors or P-type transistors.

2. Description of the Related Technology

According to a sequential emission method for driving an organic light emitting diode (OLED) display device, data may be scanned by each scan-line in response to a scan signal that is sequentially applied. Organic light emitting diodes may emit light according to each scan-line in response to an emission signal that is also sequentially applied. Thus, a continuous dimming effect may be achieved by controlling an off duty ratio (i.e., a length of a period in which the emission signal is not applied). In addition, a motion blur may be eliminated because an off duty ratio provides a black band insertion effect.

However, in case that an emission driver that provides the emission signal is implemented by complementary metal-oxide semiconductor (CMOS) transistors, an operational speed of the emission driver may be slow, and an inversion input signal may be additionally required for proper operation of the emission driver

SUMMARY OF CERTAIN INVENTIVE ASPECTS

One inventive aspect is an emission driving unit, which includes an input signal generating circuit configured to receive a frame line mark (FLM) signal according to a first clock signal, to receive a second clock signal according to the FLM signal, and to output a sequential input signal. The emission driving unit also includes an inverter circuit configured to receive the FLM signal according to the first clock signal, and to invert the FLM signal to generate an inverter output signal. The emission driving unit also includes an output switching circuit configured to output a first voltage having a logic high level or a second voltage having a logic low level as an emission signal in response to the inverter output signal, where the input signal generating circuit, the inverter circuit, and the output switching circuit are implemented by transistors of only N-type or P-type.

Another inventive aspect is an emission driver, which includes a first emission driving unit configured to receive a frame line mark (FLM) signal as an input signal, and to output a first emission signal and a first sequential input signal, the first emission driving unit being controlled by a first clock signal and a second clock signal. The emission driver also includes second through (n)th emission driving units, where n is an integer greater than or equal to 3. The emission driving units are configured to output second through (n)th emission signals, respectively. The second through (n)th emission driving units are controlled by the first clock signal and the second clock signal. The first through (n−1)th emission driving units sequentially provide the first sequential input signal and second through (n−1)th sequential input signals as the input signal to the second through (n)th emission driving units, respectively, and each of the first through (n)th emission driving units includes an input signal generating circuit configured to receive the input signal according to the first clock signal, to receive the second clock signal according to the input signal, and to output one of the first through (n−1)th sequential input signals. Each emission driving unit also includes an inverter circuit configured to receive the input signal according to the first clock signal, and to invert the input signal to generate an inverter output signal. Each emission driving unit also includes an output switching circuit configured to output a first voltage having a logic high level or a second voltage having a logic low level as one of the first through (n)th emission signals in response to the inverter output signal.

Another inventive aspect is an organic light emitting diode display device including a display panel configured to receive a first power voltage and a second power voltage. The display panel has a plurality of pixel circuits, and each of the pixel circuits includes an organic light emitting diode, and a scan driver configured to sequentially provide first through (n)th scan signals, where n is an integer greater than or equal to 3, to the pixel circuits via first through (n)th scan-lines. The display panel also includes a data driver configured to provide data voltages to the pixel circuits via a plurality of data-lines according to the first through (n)th scan signals, an emission driver configured to sequentially provide first through (n)th emission signals to the pixel circuits via first through (n)th emission control-lines, and a timing controller configured to provide a first clock signal and a second clock signal to the scan driver, the data driver, and the emission driver. The emission driver includes first through (n)th emission driving units that generate the first through (n)th emission signals, respectively, and each of the first through (n)th emission driving units is controlled by the first clock signal and the second clock signal. Each of the first through (n)th emission driving units is implemented by transistors of the same kind, and the first through (n)th emission driving units receive a frame line mark (FLM) signal and first through (n−1)th sequential input signals as an input signal, respectively.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF CERTAIN INVENTIVE EMBODIMENTS

Various example embodiments are described more fully hereinafter with reference to the accompanying drawings, in which some example embodiments are shown. The presented concepts may, however, be embodied in many different forms and should not be construed as limited to the example embodiments set forth herein. Rather, these example embodiments are provided so that this disclosure is thorough and complete, and will convey the scope of the presented concepts to those skilled in the art. In the drawings, the sizes and relative sizes of layers and regions may be exaggerated for clarity. Like numerals generally refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the presented concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the presented concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
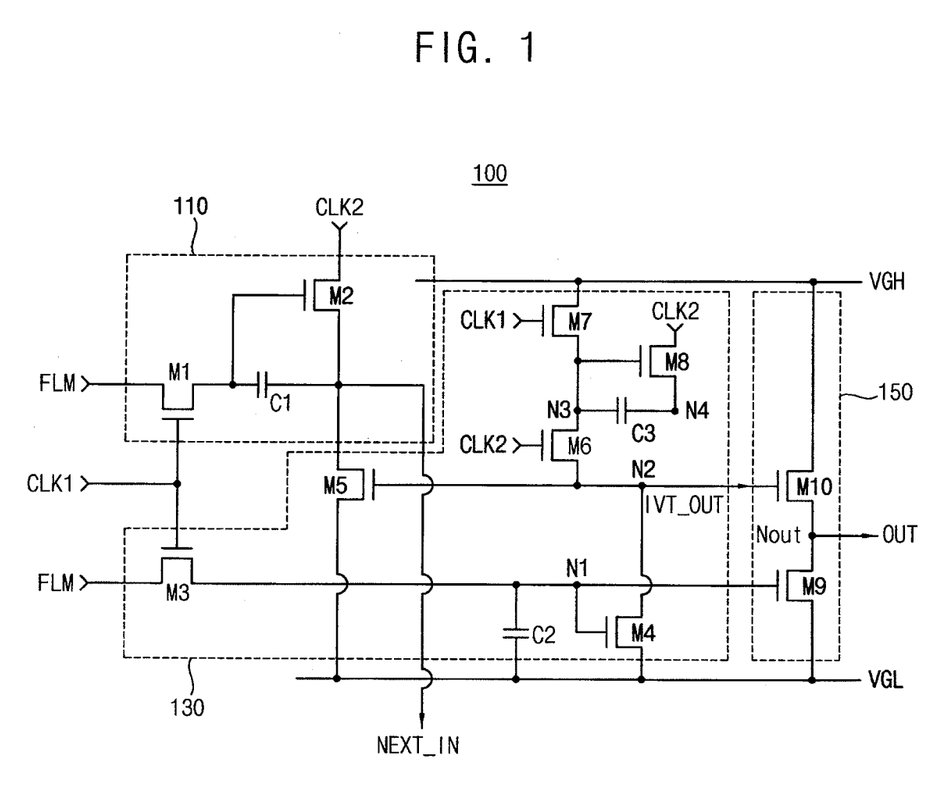
FIG. 1 is a circuit diagram illustrating an emission driving unit according to example embodiments.

FIG. 1 is a circuit diagram illustrating an emission driving unit according to example embodiments.

Referring to FIG. 1, the emission driving unit 100 may include an input signal generating circuit 110, an inverter circuit 130, and an output switching circuit 150.

In one example embodiment, the emission driving unit 100 may be implemented by only N-channel metal-oxide semiconductor (NMOS) transistors. In another example embodiment, the emission driving unit 100 may be implemented by only P-channel metal-oxide semiconductor (PMOS) transistors. A conventional emission driving unit is implemented by complementary metal-oxide semiconductor (CMOS) transistors including NMOS transistors and PMOS transistors. As a result, although the conventional emission driving unit consumes low power, an operational speed of the conventional emission driving unit may be slow, and an inversion input signal may be additionally required for an operation of the conventional emission driving unit. Therefore, the emission driving unit 100 may include an inverter circuit. As a result, the emission driving unit 100 may be implemented by only N-type transistors or only P-type transistors, and may be controlled by one non-inversion input signal and two clock signals. As illustrated in FIG. 1, the emission driving unit 100 may be implemented by only NMOS transistors. Hereinafter, a structure and an operation of the emission driving unit 100 implemented by only NMOS transistors is described in detail.

The input signal generating circuit 110 may receive a frame line mark signal FLM in response to a first clock signal CLK1, may receive a second clock signal CLK2 according to the frame line mark signal FLM, and may output a sequential input signal NEXT_IN. In one example embodiment, the input signal generating circuit 110 may include a first transistor M1, a second transistor M2, and a first capacitor C1. The first transistor M1 may include a source electrode, a drain electrode for receiving the frame line mark signal FLM, and a gate electrode for applying the frame line mark signal FLM to the source electrode in response to the first clock signal CLK1. The second transistor M2 may include a drain electrode for receiving the second clock signal CLK2, a gate electrode coupled to the source electrode of the first transistor M1, and a source electrode for outputting the sequential input signal NEXT_IN. The first capacitor C1 may be coupled between the source electrode of the first transistor M1 and the source electrode of the second transistor M2.

The inverter circuit 130 may receive the frame line mark signal FLM in response to the first clock signal CLK1, and may generate an inverter output signal IVT_OUT by inverting the frame line mark signal FLM. In one example embodiment, the inverter circuit 130 may include third through eighth transistors M3 through M8, and first through third capacitors C1 through C3.

In the inverter circuit 130, the third transistor M3 may provide the frame line mark signal FLM to a first node N1 in response to the first clock signal CLK1. The fourth transistor M4 may include a gate electrode coupled to the first node N1, a source electrode coupled to a second voltage supply terminal VGL, and a drain electrode coupled to a second node N2. The second capacitor C2 may be coupled between the first node N1 and the second voltage supply terminal VGL. The fifth transistor M5 may include a drain electrode coupled to the source electrode of the second transistor M2 of the input signal generating circuit 110, a source electrode coupled to the second voltage supply terminal VGL, and a gate electrode coupled to the second node N2. The sixth transistor M6 may include a source electrode coupled to the second node N2, a drain electrode coupled to a third node N3, and a gate electrode for receiving the second clock signal CLK2. The seventh transistor M7 may include a source electrode coupled to the third node N3, a drain electrode coupled to a first voltage supply terminal VGH, and a gate electrode for receiving the first clock signal CLK1. The eighth transistor M8 may include a gate electrode coupled to the third node N3, a drain electrode for receiving the second clock signal CLK2, and a source electrode coupled to a fourth node N4. The third capacitor C3 may be coupled between the third node N3 and the fourth node N4.

The inverter circuit 130 may invert an input signal to output an inverted input signal in response to a clock signal that is periodically applied. Therefore, the inverter circuit 130 may generate the inverter output signal IVT_OUT by inverting the frame line mark signal FLM in response to the first and second clock signals CLK1 and CLK2. An operation of the inverter circuit 130 is described in detail with reference to FIGS. 3A and 3B.

The output switching circuit 150 may output a first voltage VGH having a logic high level or a second voltage VGL having a logic low level as an emission signal OUT in response to the inverter output signal IVT_OUT. Hence, the emission signal OUT output from the emission driving unit 100 may have a pulse shape. In one example embodiment, the output switching circuit 150 may include an output terminal Nout, a ninth transistor M9, and a tenth transistor M10. The emission signal OUT may be output at the output terminal Nout. The ninth transistor M9 may include a gate electrode coupled to the first node N1, a source electrode coupled to the second voltage supply terminal VGL, and a drain electrode coupled to the output terminal Nout. The tenth transistor M10 may include a gate electrode coupled to the second node N2, a source electrode coupled to the output terminal Nout, and a drain electrode coupled to the first voltage supply terminal VGH.

In the emission driving unit 100, the emission signal OUT may have an inverted shape of the frame line mark signal FLM. In one example embodiment, when the frame line mark signal FLM has one high-pulse that rises from a logic low level to a logic high level, the emission signal OUT may have one low-pulse that falls from a logic high level to a logic low level. Here, since an emission transistor included in a pixel circuit is also an NMOS transistor, the emission transistor may turn-off in a period corresponding to a logic low level of the emission signal OUT. On the other hand, the emission transistor may turn-on in a period corresponding to a logic high level of the emission signal OUT, so that an organic light emitting diode coupled to the emission transistor may emit light.

In one example embodiment, the emission signal OUT (e.g., may be referred to as a first voltage) may have a high voltage level enough to turn-on an NMOS transistor (e.g., the emission transistor), and the emission signal OUT (e.g., may be referred to as a second voltage) may have a low voltage level enough to turn-off an NMOS transistor (e.g., the emission transistor).

Figure 2A:
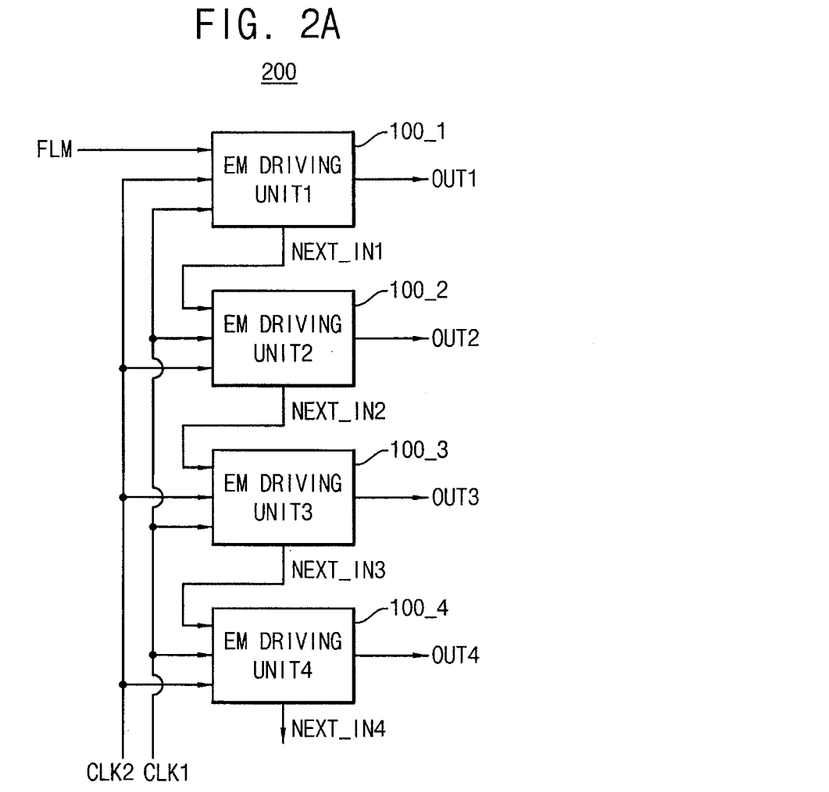
FIG. 2A is a block diagram illustrating an emission driver according to example embodiments.

FIG. 2A is a block diagram illustrating an emission driver according to example embodiments.

Referring to FIG. 2A, the emission driver 200 may include a plurality of emission driving units 100_1 through 100_4. Here, the number of emission driving units corresponds to the number of scan-lines of an organic light emitting display device. For example, in case that there are N scan-lines between a display panel and a scan driver, the emission driver 200 may include N emission driving units 100_1 through 100_N. Although first through fourth emission driving units 100_1 through 100_4 are illustrated in FIG. 2A, the number of emission driving units are not limited thereto. Hereinafter, an operation of the emission driver 200 is described in detail.

The first emission driving unit 100_1 may receive a frame line mark signal FLM as an input signal, and may output a first emission signal OUT1 and a first sequential input signal NEXT_IN1. Here, the first emission driving unit 100_1 may be controlled by a first clock signal CLK1 and a second clock signal CLK2. The first emission signal OUT1 may be applied to a display panel via a first emission line. The first sequential input signal NEXT_IN1 may be applied as an input signal to a next stage (i.e., the second emission driving unit 100_2). In other words, a sequential input signal output from one stage may be used as an input signal for another stage that is adjacent to the stage. Thus, if an input signal FLM is input to the first emission driving unit 100_1, the first through third sequential input signals NEXT_IN1 through NEXT_IN3 output from the first through third emission driving units 100_1 through 100_3 may be applied to the second through fourth emission driving unit 100_2 through 100_4, respectively.

Each of the emission driving units 100_1 through 100_4 may include an input signal generating circuit, an inverter circuit, and an output switching circuit. The input signal generating circuit may receive an input signal (i.e., FLM, NEXT_IN1 through NEXT_IN3) in response to the first clock signal CLK1, may receive the second clock signal CLK2 in response to the input signal (i.e., FLM, NEXT_IN1 through NEXT_IN3), and may output one signal of the first through fourth sequential input signals NEXT_IN1 through NEXT_IN4. The inverter circuit may receive an input signal (i.e., FLM, NEXT_IN1 through NEXT_IN3) in response to the first clock signal CLK1, and may invert the input signal (i.e., FLM, NEXT_IN1 through NEXT_IN3) to generate an inverter output signal. The output switching circuit may output a first voltage having a logic high level or a second voltage having a logic low level as one signal of the first through fourth emission signals OUT1 through OUT4 in response to the inverter output signal. As described above, the emission driver 200 may be controlled by only three signals (i.e., FLM, CLK1, and CLK2) without any additional inversion signal. In one example embodiment, each of the emission driving units 100_1 through 100_4 may be implemented by transistors of the same kind (i.e., only N-type transistors or only P-type transistors).

Figure 2B:
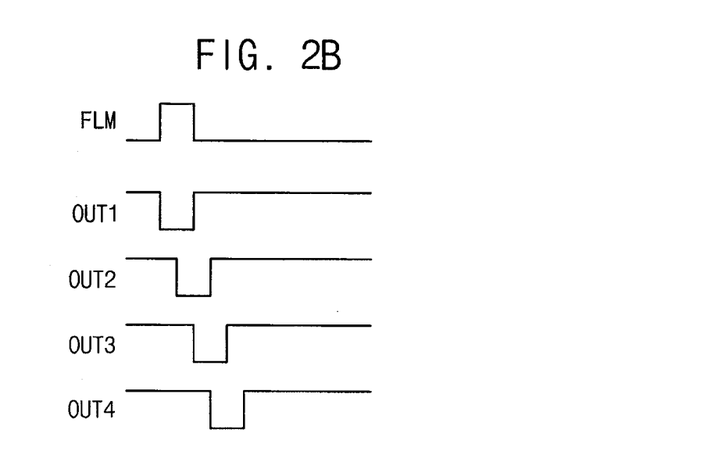
FIG. 2B is a timing diagram illustrating an operation of an emission driver of FIG. 2A.

FIG. 2B is a timing diagram illustrating operations of an emission driver of FIG. 2A.

Referring to FIGS. 2A and 2B, after the frame line mark signal FLM is applied to the first emission driving unit 100_1, the first through fourth emission signals OUT1 through OUT4 are sequentially output as the first through third sequential input signals NEXT_IN1, NEXT_IN2, and NEXT_IN3 are sequentially applied to the second through fourth emission driving unit 100_2 through 100_4. That is, a low-pulse of the emission signal (i.e., OUT1 through OUT4) may be shifted by a predetermined time interval. Therefore, organic light emitting diodes may emit light by each scan-line in a display panel that receives the first through fourth emission signals OUT1 through OUT4. In one example embodiment, each of the first through fourth emission signals OUT1 through OUT4 may have an inverted shape of the frame line mark signal FLM.

Figure 3A:
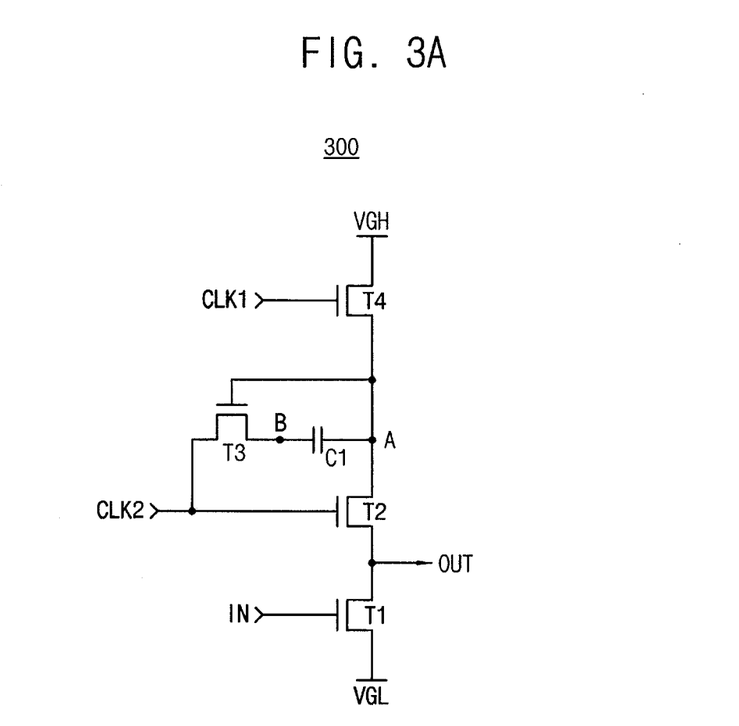
FIG. 3A is a circuit diagram illustrating an inverter circuit included in an emission driving unit of FIG. 1.
Figure 3B:
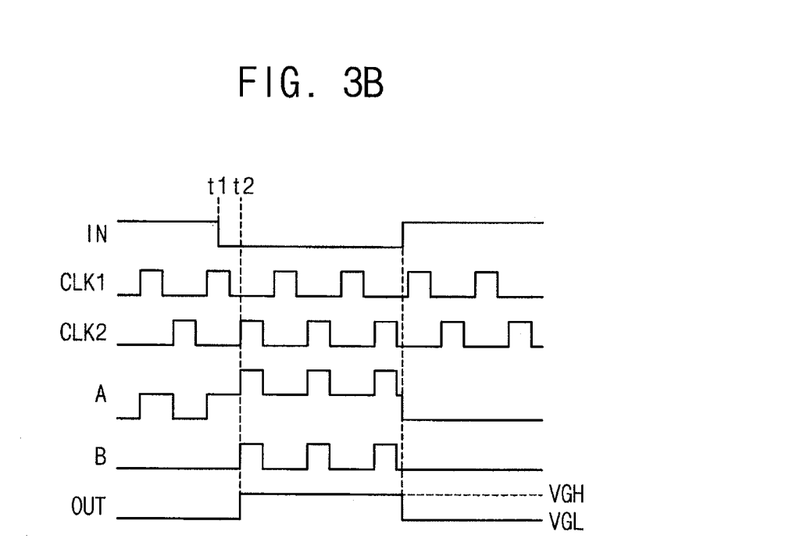
FIG. 3B is a timing diagram illustrating an operation of an inverter circuit of FIG. 3A.

FIG. 3A is a circuit diagram illustrating an inverter circuit included in an emission driving unit of FIG. 1. FIG. 3B is a timing diagram illustrating operations of an inverter circuit of FIG. 3A.

Referring to FIGS. 3A and 3B, the inverter circuit 300 may correspond to the inverter circuit 130 of FIG. 1. In detail, an input signal IN, an output signal OUT, and a node A of the inverter circuit 300 may correspond to the frame line mark signal FLM, the inverter output signal IVT_OUT, and the third node N3 of the inverter circuit 130 of FIG. 1, respectively. As illustrated in FIG. 3A, the inverter circuit 300 may be implemented with NMOS transistors. Hereinafter, an operation of the inverter circuit 300 is described in detail.

The first transistor T1 may output a second voltage VGL having a logic low level as the output signal OUT in response to the input signal IN having a logic high level. Namely, when the input signal IN has a logic high level, the first transistor T1 may turn-on. Thus, the second voltage VGL may be output as the output signal OUT. On the other hand, when the input signal IN has a logic low level, the first transistor T1 may turn-off. Thus, a first voltage VGH having a logic high level may be output as the output signal OUT based on a first clock signal CLK1 and a second clock signal CLK2. In detail, the output signal OUT may become the first voltage VGH (i.e., a level of the output signal OUT may rise to a logic high level) at a rising edge t2 of the second clock signal CLK2 following a falling edge t1 of the input signal IN. In this way, the input signal IN may be inverted by the inverter circuit 300, and then an inverted signal of the input signal IN may be output as the output signal OUT.

Figure 4:
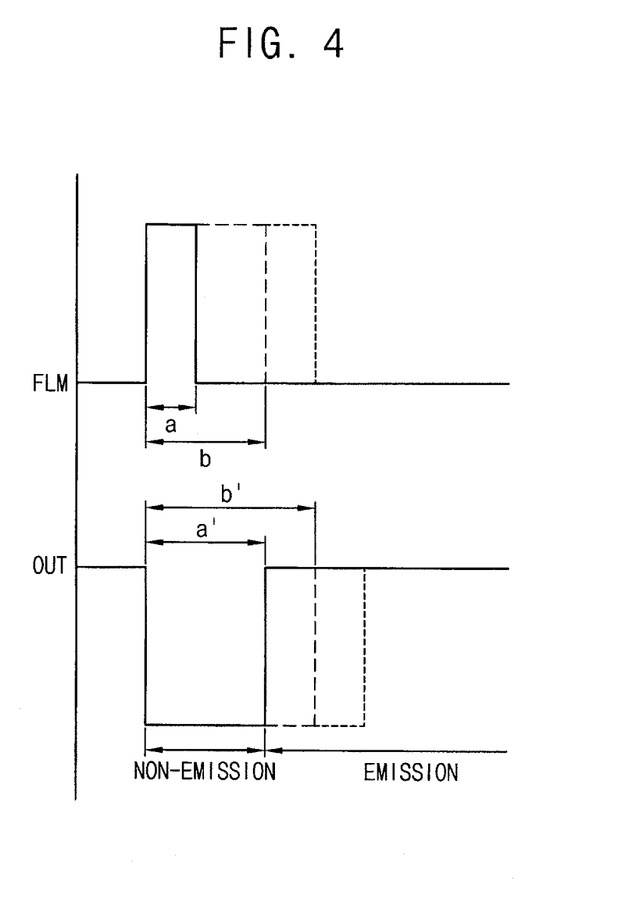
FIG. 4 is a diagram illustrating a relation between an input and an output of an emission driving unit of FIG. 1.

FIG. 4 is a diagram illustrating a relation between an input and an output of an emission driving unit of FIG. 1.

Referring to FIGS. 1 and 4, an output signal OUT may have an inverted shape of an input signal FLM. Here, the input signal FLM may correspond to the frame line mark signal FLM of FIG. 1, and the output signal OUT may correspond to the emission signal OUT of FIG. 1. In one example embodiment, an organic light emitting display device may be implemented with NMOS transistors. In this case, organic light emitting diodes may emit light when an emission signal having a logic high level is applied. On the other hand, organic light emitting diodes may not emit light when an emission signal having a logic low level is applied. Thus, a period in which an emission signal having a logic low level is applied may correspond to a non-emission period.

As illustrated in FIG. 4, a pulse width of a logic high level of the input signal FLM may be proportional to a pulse width of a logic low level of the output signal OUT. For instance, as a pulse width of a logic high level of the input signal FLM increases from "a" to "b", a pulse width of a logic low level of the output signal OUT may increase from "a'" to "b'". Thus, a length of the non-emission period may increase. According to this embodiment, a length of the non-emission period may be adjusted by adjusting a pulse width of a logic high level of the frame line mark signal FLM input to the emission driving unit 100. In the non-emission period, operations such as data scan, threshold voltage compensation, etc are performed for a pixel circuit. Hence, this embodiment may achieve a sufficient time for performing the operations such as data scan, threshold voltage compensation, etc by adjusting a length of the non-emission period.

In addition, since organic light emitting diodes do not emit light in the non-emission period, this embodiment may achieve a continuous dimming effect by adjusting a length of the non-emission period. Further, the this embodiment may eliminate a motion blur by adjusting a length of the non-emission period because the non-emission period provides a black band insertion effect. Thus, an impulse driving operation may be performed using the emission driving unit 100 that is implemented with NMOS transistors.

Figure 5:
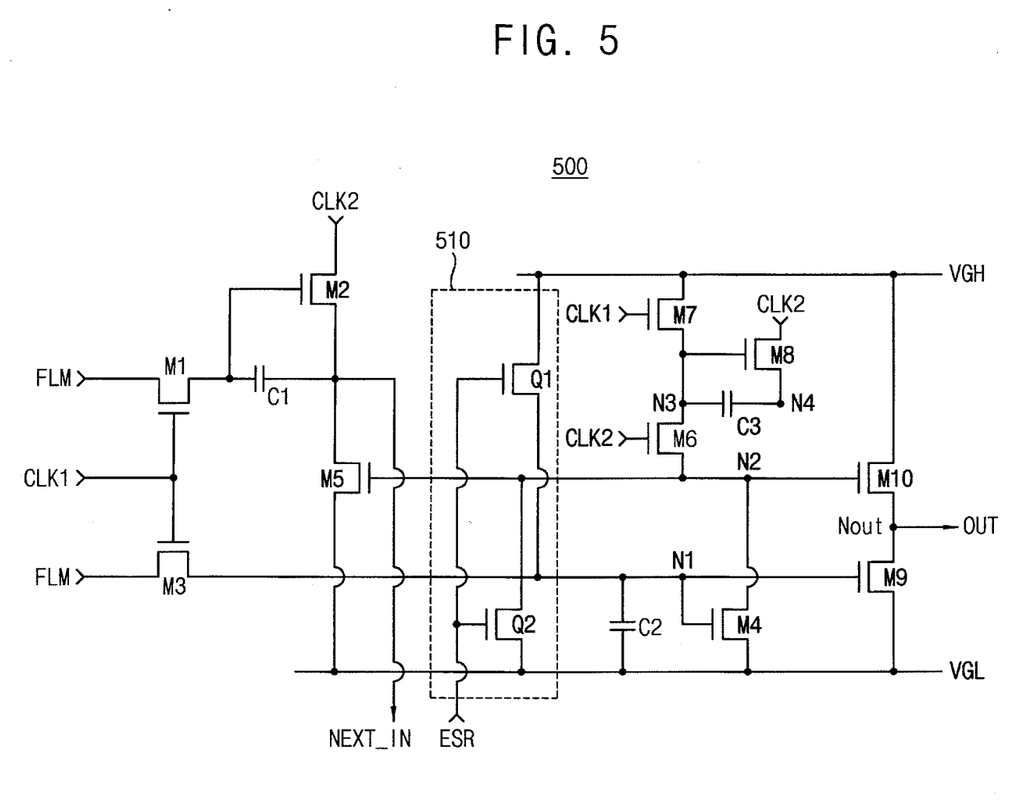
FIG. 5 is a circuit diagram illustrating an emission driving unit according to example embodiments.

FIG. 5 is a circuit diagram illustrating an emission driving unit according to example embodiments.

Referring to FIG. 5, except for an output control circuit 510, the emission driving unit 500 may have the same structure as the emission driving unit 100 of FIG. 1. Thus, repeated descriptions of features of the emission driving unit 100 of FIG. 1 are omitted below. Hereinafter, operation of the emission driving unit 500 is described with focus on the output control circuit 510.

The output control circuit 510 may be coupled to an inverter circuit, and may be controlled by an output control signal ESR. The output control circuit 510 may include a first output control transistor Q1 and a second output control transistor Q2.

In one example embodiment, when the output control signal having a logic high level is applied to the output control circuit 510, a second voltage VGL having a DC level may be output as an emission signal OUT. In detail, when the output control signal ESR having a logic high level is applied, the first and second output control transistors Q1 and Q2 may turn-on. As a result, a ninth transistor M9 may turn-on because a first voltage VGH having a logic high level is applied to a gate electrode of the ninth transistor M9. In addition, a tenth transistor M10 may turn-off because the second voltage VGL having a logic low level is applied to a gate electrode of the tenth transistor M10. Thus, the second voltage VGL may be output as the emission signal OUT by the ninth transistor M9. As described above, the emission driving unit 500 having the output control circuit 510 may control the emission signal OUT to have a DC level. For example, if an organic light emitting display device is implemented with NMOS transistors, the emission driving unit 500 may control the emission signal OUT to have a logic low DC level. On the other hand, if an organic light emitting display device is implemented with PMOS transistors, the emission driving unit 500 may control the emission signal OUT to have a logic high DC level. In addition, when the output control signal ESR having a logic low level is applied to the output control circuit 510, the first and second output control transistors Q1 and Q2 may turn-off. As a result, the emission driving unit 500 may be substantially the same circuit as the emission driving unit 100 of FIG. 1.

As described above, the output control circuit 510 may perform a function (or, operation) for maintaining the emission signal OUT to be a DC signal having a logic high level or a logic low level. In one example embodiment, the emission driving unit 500 having the output control circuit 510 may be used for initially operating an organic light emitting display device. When an organic light emitting display device is initially operated, a preparation time for a normal operation mode may be required. At this time (i.e., during the preparation time), it may be beneficial to prevent organic light emitting diodes from emitting light. Therefore, the output control signal ESR having a logic low level may be applied to the output control circuit 510 when initially operating an organic light emitting display device. As a result, organic light emitting diodes may be controlled to be in a turn-off state because the emission signal OUT has a logic low DC level during the preparation time.

Figure 6:
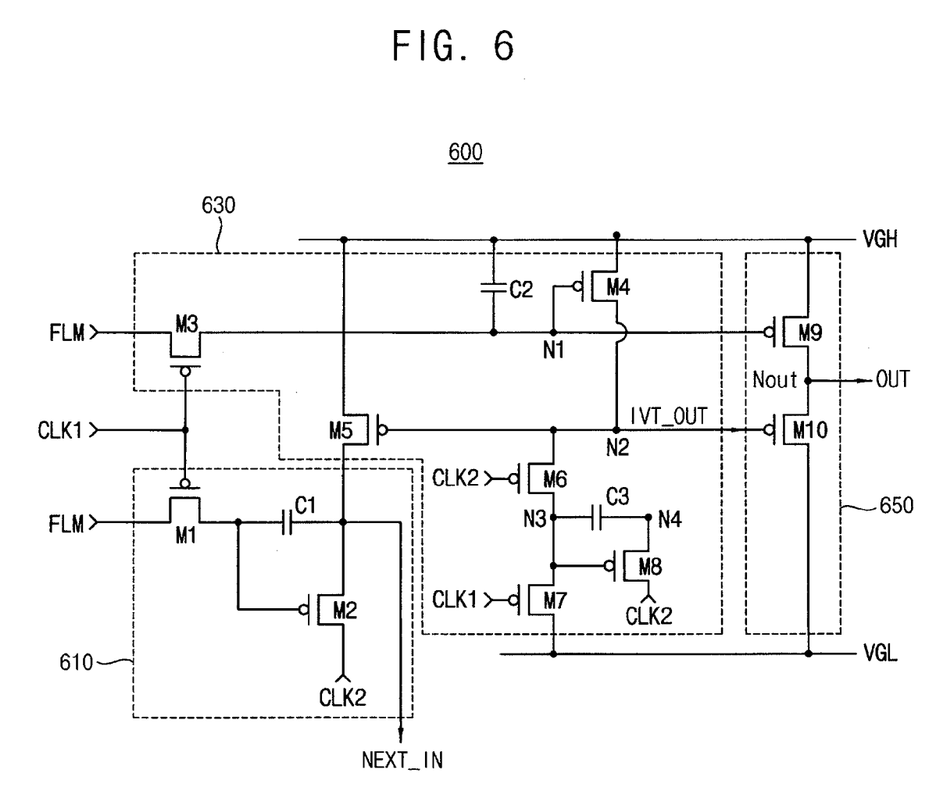
FIG. 6 is a circuit diagram illustrating an emission driving unit according to example embodiments.

FIG. 6 is a circuit diagram illustrating an emission driving unit according to example embodiments. Here, the emission driving unit 600 may be implemented with PMOS transistors. Referring to FIG. 6, the emission driving unit 600 may include an input signal generating circuit 610, an inverter circuit 630, and an output switching circuit 650.

The input signal generating circuit 610 may receive a frame line mark signal FLM in response to a first clock signal CLK1, may receive a second clock signal CLK2 in response to the frame line mark signal FLM, and may output a sequential input signal NEXT_IN. In one example embodiment, the input signal generating circuit 610 may include a first transistor M1, a second transistor M2, and a first capacitor C1. The first transistor M1 may include a drain electrode, a source electrode for receiving the frame line mark signal FLM, and a gate electrode for applying the frame line mark signal FLM to the drain electrode in response to the first clock signal CLK1. The second transistor M2 may include a source electrode for receiving the second clock signal CLK2, a gate electrode coupled to the drain electrode of the first transistor M1, and a drain electrode for outputting the sequential input signal NEXT_IN. The first capacitor C1 may be coupled between the drain electrode of the first transistor M1 and the drain electrode of the second transistor M2.

The inverter circuit 630 may receive the frame line mark signal FLM in response to the first clock signal CLK1, and may generate an inverter output signal IVT_OUT by inverting the frame line mark signal FLM. In one example embodiment, the inverter circuit 630 may include third through eighth transistors M3 through M8, and first through third capacitors C1 through C3.

In the inverter circuit 630, the third transistor M3 may provide the frame line mark signal FLM to a first node N1 in response to the first clock signal CLK1. The fourth transistor M4 may include a gate electrode coupled to the first node N1, a source electrode coupled to a first voltage supply terminal VGH, and a drain electrode coupled to a second node N2. The second capacitor C2 may be coupled between the first node N1 and the first voltage supply terminal VGH. The fifth transistor M5 may include a drain electrode coupled to the drain electrode of the second transistor M2 of the input signal generating circuit 610, a source electrode coupled to the first voltage supply terminal VGH, and a gate electrode coupled to the second node N2. The sixth transistor M6 may include a source electrode coupled to the second node N2, a drain electrode coupled to a third node N3, and a gate electrode for receiving the second clock signal CLK2. The seventh transistor M7 may include a source electrode coupled to the third node N3, a drain electrode coupled to a second voltage supply terminal VGL, and a gate electrode for receiving the first clock signal CLK1. The eighth transistor M8 may include a gate electrode coupled to the third node N3, a source electrode for receiving the second clock signal CLK2, and a drain electrode coupled to a fourth node N4. The third capacitor C3 may be coupled between the third node N3 and the fourth node N4. The inverter circuit 630 may generate the inverter output signal IVT_OUT by inverting the frame line mark signal FLM in response to the first and second clock signals CLK1 and CLK2.

The output switching circuit 650 may output a first voltage VGH having a logic high level or a second voltage VGL having a logic low level as an emission signal OUT in response to the inverter output signal IVT_OUT. Hence, the emission signal OUT output from the emission driving unit 600 may have a pulse shape. In one example embodiment, the output switching circuit 650 may include an output terminal Nout, a ninth transistor M9, and a tenth transistor M10. The emission signal OUT may be output at the output terminal Nout. The ninth transistor M9 may include a gate electrode coupled to the first node N1, a source electrode coupled to the first voltage supply terminal VGH, and a drain electrode coupled to the output terminal Nout. The tenth transistor M10 may include a gate electrode coupled to the second node N2, a source electrode coupled to the output terminal Nout, and a drain electrode coupled to the second voltage supply terminal VGL.

In the emission driving unit 600, the emission signal OUT may have an inverted shape of the frame line mark signal FLM. In one example embodiment, when the frame line mark signal FLM has one low-pulse that falls from a logic high level to a logic low level, the emission signal OUT may have one high-pulse that rises from a logic low level to a logic high level. Here, since an emission transistor included in a pixel circuit is also a PMOS transistor, the emission transistor may turn-off in a period corresponding to a logic high level of the emission signal OUT. On the other hand, the emission transistor may turn-on in a period corresponding to a logic low level of the emission signal OUT, so that an organic light emitting diode coupled to the emission transistor may emit light.

In one example embodiment, the emission signal OUT (e.g., may be referred to as a first voltage) may have a high voltage level enough to turn-off an PMOS transistor (i.e., the emission transistor), and the emission signal OUT (e.g., may be referred to as a second voltage) may have a low voltage level enough to turn-on an PMOS transistor (i.e., the emission transistor).

Figure 7:
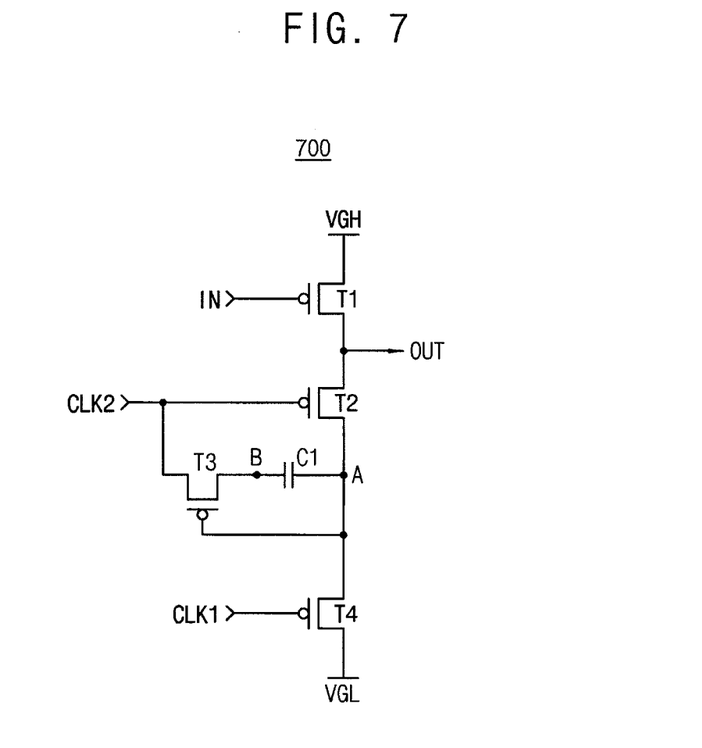
FIG. 7 is a circuit diagram illustrating an inverter circuit included in an emission driving unit of FIG. 6.

FIG. 7 is a circuit diagram illustrating an inverter circuit included in an emission driving unit of FIG. 6.

Referring to FIG. 7, the inverter circuit 700 may correspond to the inverter circuit 630 of FIG. 6. In detail, an input signal IN, an output signal OUT, and a node A of the inverter circuit 700 may correspond to the frame line mark signal FLM, the inverter output signal IVT_OUT, and the third node N3 of the inverter circuit 630 of FIG. 6, respectively. As illustrated in FIG. 7, the inverter circuit 700 may be implemented with PMOS transistors. The first transistor T1 may output a first voltage VGH having a logic high level as the output signal OUT in response to the input signal IN having a logic low level. When the input signal IN has a logic high level, the first transistor T1 may turn-off. Thus, a second voltage VGL having a logic low level may be output as the output signal OUT based on a first clock signal CLK1 and a second clock signal CLK2.

Figure 8:
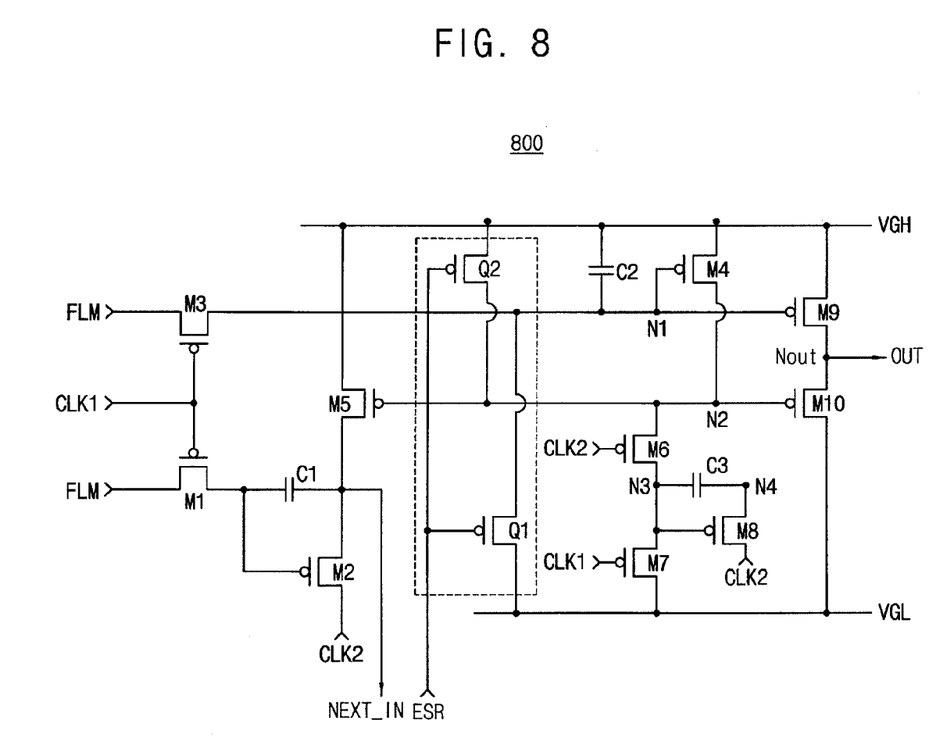
FIG. 8 is a circuit diagram illustrating an emission driving unit according to example embodiments.

FIG. 8 is a circuit diagram illustrating an emission driving unit according to example embodiments. Referring to FIG. 8, except for an output control circuit 810, the emission driving unit 800 may have the same structure as the emission driving unit 600 of FIG. 6.

The output control circuit 810 may be coupled to an inverter circuit, and may be controlled by an output control signal ESR. The output control circuit 810 may include a first output control transistor Q1 and a second output control transistor Q2.

In one example embodiment, when the output control signal having a logic low level is applied to the output control circuit 810, a first voltage VGH having a DC level may be output as an emission signal OUT. In detail, when the output control signal ESR having a logic low level is applied, the first and second output control transistors Q1 and Q2 may turn-on. As a result, a ninth transistor M9 may turn-on because a second voltage VGL having a logic low level is applied to a gate electrode of the ninth transistor M9. In addition, a tenth transistor M10 may turn-off because the first voltage VGH having a logic high level is applied to a gate electrode of the tenth transistor M10. Thus, the first voltage VGH may be output as the emission signal OUT by the ninth transistor M9. On the other hand, when the output control signal ESR having a logic high level is applied to the output control circuit 810, the first and second output control transistors Q1 and Q2 may turn-off. As a result, the emission driving unit 800 may be substantially the same circuit as the emission driving unit 600 of FIG. 6.

Figure 9:
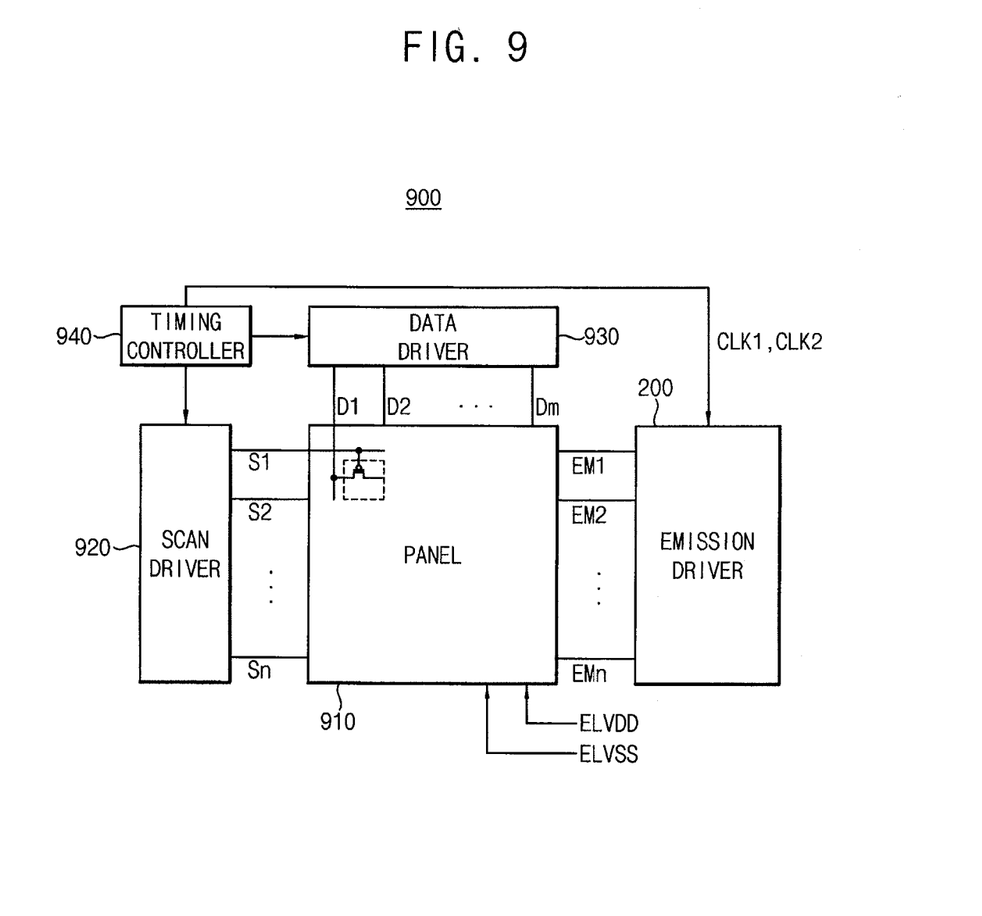
FIG. 9 is a block diagram illustrating an organic light emitting display device according to example embodiments.

FIG. 9 is a block diagram illustrating an organic light emitting display device according to example embodiments. Referring to FIG. 9, the organic light emitting display device 900 may include a display panel 910, a scan driver 920, a data driver 930, an emission driver 200, and a timing controller 940.

The display panel 910 may include a plurality of pixel circuits. The display panel 910 may receive a first power voltage ELVDD and a second power voltage ELVSS. Each pixel circuit may include an organic light emitting diode. The scan driver 920 may sequentially provide first through (n)th scan signals to the pixel circuits via first through (n)th scan-lines S1 through Sn, where n is an integer greater than or equal to 3. The data driver 930 may provide data voltages to the pixel circuits via a plurality of data-lines D1 through Dm based on the first through (n)th scan signals. The emission driver 200 may sequentially provide first through (n)th emission signals to the pixel circuits via first through (n)th emission control-lines EM1 through EMn. The timing controller 940 may provide a first clock signal CLK1 and a second clock signal CLK2 to the scan driver 920, the data driver 930, and the emission driver 200.

In one example embodiment, the emission driver 200 may include first through (n)th emission driving units that generates the first through (n)th emission signals, respectively. In example embodiments, each of the first through (n)th emission driving units may include an inverter circuit. Hence, each of the first through (n)th emission driving units may be implemented by only NMOS transistors or only PMOS transistors. Each of the first through (n)th emission driving units may be controlled by the first clock signal CLK1 and the second clock signal CLK2. In addition, the first through (n)th emission driving units may receive a frame line mark (FLM) signal and first through (n−1)th sequential input signals as an input signal, respectively.

In example embodiments, the emission driver 200 may be implemented with NMOS transistors. In this case, a period in which the first through (n)th emission signals have a logic low level may correspond to a period in which a data programming operation is performed for the pixel circuits. In addition, a period in which the first through (n)th emission signals have a logic high level may correspond to a period in which organic light emitting diodes included in the pixel circuits emit light.

Meanwhile, the emission driver 200 may adjust a length of a period in which the display panel 910 displays a black image by controlling an off duty ratio of the first through (n)th emission signals. Thus, an impulse driving operation may be performed using the emission driver 200 that is implemented by transistors of the same kind (i.e., only N-type transistors or only P-type transistors).

In one example embodiment, as the emission driver 200 sequentially provide the first through (n)th emission signals to the pixel circuits, the organic light emitting diodes included in the pixel circuits may sequentially emit light.

Figure 10:
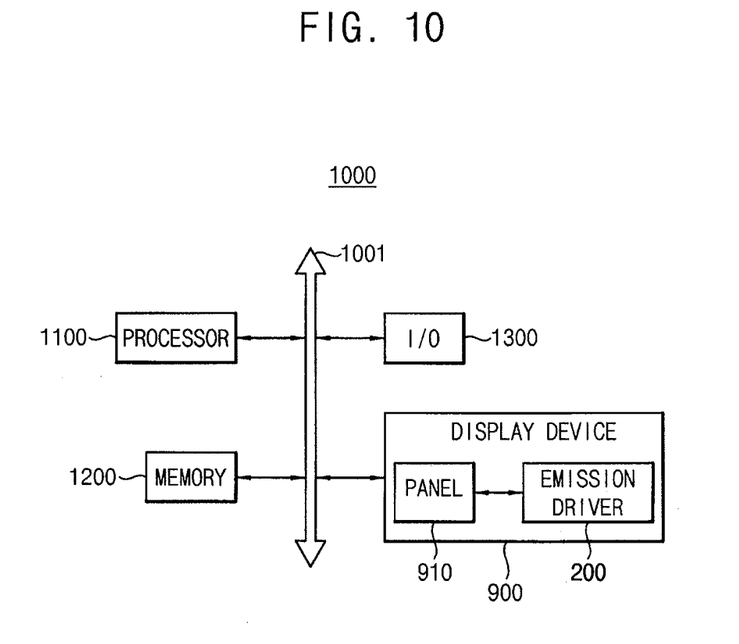
FIG. 10 is a block diagram illustrating an electric device having an organic light emitting display device of FIG. 9.

FIG. 10 is a block diagram illustrating an electric device having an organic light emitting display device of FIG. 9. Referring to FIG. 10, the electric device 1000 may include a processor 1100, a memory device 1200, an input/output (I/O) device 1300, and an organic light emitting display (OLED) device 900. Here, the electric device 100 may correspond to any system having the OLED device 900 such as a cellular phone, a smart phone, a smart pad, a television, a personal digital assistant (PDA), a MP3 player, a laptop, a computer, a digital camera, etc.

The processor 1100 may perform various computing functions. For example, the processor 1100 may be a microprocessor, a central processing unit (CPU), etc. The processor 1100 may be coupled to the memory device 1200 and the OLED device 900 via a bus 1001. The processor 1100 may perform communications with the memory device 1200 and the OLED device 900 via an address bus, a control bus, a data bus, etc. According to some example embodiments, the processor 1100 may be coupled to an extended bus such as a peripheral component interconnection (PCI) bus.

The memory device 1200 may store data for operations of the electric device 1000. For example, the memory device 1200 may include a volatile memory device such as a dynamic random access memory (DRAM) device, a static random access memory (SRAM) device, a mobile DRAM, etc, and a non-volatile memory device such as an erasable programmable read-only memory (EPROM) device, an electrically erasable programmable read-only memory (EEPROM) device, a flash memory device, etc.

The I/O device 1300 may be coupled to the bus 1001. The I/O device may include input means such as a keyboard, a mouse, a keypad, etc, and output means such as a printer, etc. The processor 1100 may control operations of the I/O device 1300.

The OLED device 900 may be coupled to the processor 1100 via the bus 1001. The OLED device 900 may include a display panel 910 and an emission driver 200. As described above, the emission driver 200 may include an inverter circuit. Thus, the emission driver 200 may be implemented by transistors of the same kind (i.e., only N-type transistors or only P-type transistors). In addition, the emission driver 200 may freely adjust a pulse width of an emission signal by adjusting a pulse width of an input signal.

The presented concepts may be applied to an electric device having a display device. For example, the presented concepts may be applied to a monitor, a laptop, a PDA, a cellular phone, a smart phone, a smart pad, etc. The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the presented concepts. Accordingly, all such modifications are intended to be included within the scope of the application. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the application.

What is claimed is:

1. An emission driving unit, comprising:
an input signal generating circuit configured to receive a frame line mark (FLM) signal according to a first clock signal, to receive a second clock signal according to the FLM signal, and to output a sequential input signal;
an inverter circuit configured to receive the FLM signal according to the first clock signal, and to invert the FLM signal to generate an inverter output signal according to the second clock signal different from the first clock signal; and
an output switching circuit configured to output a first voltage having a logic high level or a second voltage having a logic low level as an emission signal in response to the inverter output signal,
wherein the input signal generating circuit, the inverter circuit, and the output switching circuit are implemented by transistors of only N-type or P-type, and
wherein the input signal generating circuit is further configured to generate and output the sequential input signal according to the inverter output signal.

2. The unit of claim 1, wherein the emission signal is substantially an inverted version of the FLM signal.

3. The unit of claim 2, wherein the input signal generating circuit, the inverter circuit, and the output switching circuit are implemented with N-channel metal-oxide semiconductor (NMOS) transistors.

4. The unit of claim 3, wherein the input signal generating circuit includes:
a first transistor having a source electrode, a drain electrode that receives the FLM signal, and a gate electrode that receives the first clock signal, the FLM signal being transmitted from the drain electrode of the first transistor to the source electrode of the first transistor in response to the first clock signal;
a second transistor having a drain electrode that receives the second clock signal, a gate electrode coupled to the source electrode of the first transistor, and a source electrode that outputs the sequential input signal; and
a first capacitor coupled between the source electrode of the first transistor and the source electrode of the second transistor.

5. The unit of claim 4, wherein the inverter circuit includes:
a third transistor configured to transmit the FLM signal to a first node in response to the first clock signal;
a fourth transistor having a gate electrode coupled to the first node, a source electrode coupled to a second voltage supply terminal, and a drain electrode coupled to a second node;
a second capacitor coupled between the first node and the second voltage supply terminal;
a fifth transistor having a drain electrode coupled to the source electrode of the second transistor, a source electrode coupled to the second voltage supply terminal, and a gate electrode coupled to the second node;
a sixth transistor having a source electrode coupled to the second node, a drain electrode coupled to a third node, and a gate electrode that receives the second clock signal;
a seventh transistor having a source electrode coupled to the third node, a drain electrode coupled to a first voltage supply terminal, and a gate electrode that receives the first clock signal;
an eighth transistor having a gate electrode coupled to the third node, a drain electrode that receives the second clock signal, and a source electrode coupled to a fourth node; and
a third capacitor coupled between the third node and the fourth node.

6. The unit of claim 5, wherein the output switching circuit includes:
an output terminal configured to output the emission signal;
a ninth transistor having a gate electrode coupled to the first node, a source electrode coupled to the second voltage supply terminal, and a drain electrode coupled to the output terminal; and
a tenth transistor having a gate electrode coupled to the second node, a source electrode coupled to the output terminal, and a drain electrode coupled to the first voltage supply terminal.

7. The unit of claim 6, further comprising:
an output control circuit having a first output control transistor coupled between the first voltage supply terminal and the first node, and a second output control transistor coupled between the second voltage supply terminal and the second node.

8. The unit of claim 7, wherein the second voltage having a DC level is output as the emission signal when an output control signal having a logic high level is applied to the output control circuit.

9. The unit of claim 2, wherein the input signal generating circuit, the inverter circuit, and the output switching circuit are implemented with P-channel metal-oxide semiconductor (PMOS) transistors.

10. The unit of claim 9, wherein the input signal generating circuit includes:
a first transistor having a drain electrode, a source electrode that receives the FLM signal, and a gate electrode that receives the first clock signal, the FLM signal being transmitted from the source electrode of the first transistor to the drain electrode of the first transistor in response to the first clock signal;
a second transistor having a source electrode that receives the second clock signal, a gate electrode coupled to the drain electrode of the first transistor, and a drain electrode that outputs the sequential input signal; and
a first capacitor coupled between the drain electrode of the first transistor and the drain electrode of the second transistor.

11. The unit of claim 10, wherein the inverter circuit includes:
a third transistor configured to transmit the FLM signal to a first node in response to the first clock signal;
a fourth transistor having a gate electrode coupled to the first node, a source electrode coupled to a first voltage supply terminal, and a drain electrode coupled to a second node;
a second capacitor coupled between the first node and the first voltage supply terminal;
a fifth transistor having a drain electrode coupled to the drain electrode of the second transistor, a source electrode coupled to the first voltage supply terminal, and a gate electrode coupled to the second node;
a sixth transistor having a source electrode coupled to the second node, a drain electrode coupled to a third node, and a gate electrode that receives the second clock signal;
a seventh transistor having a source electrode coupled to the third node, a drain electrode coupled to a second voltage supply terminal, and a gate electrode that receives the first clock signal;
an eighth transistor having a gate electrode coupled to the third node, a source electrode that receives the second clock signal, and a drain electrode coupled to a fourth node; and a third capacitor coupled between the third node and the fourth node.

12. The unit of claim 11, wherein the output switching circuit includes:
an output terminal configured to output the emission signal;
a ninth transistor having a gate electrode coupled to the first node, a source electrode coupled to the first voltage supply terminal, and a drain electrode coupled to the output terminal; and
a tenth transistor having a gate electrode coupled to the second node, a source electrode coupled to the output terminal, and a drain electrode coupled to the second voltage supply terminal.

13. The unit of claim 11, further comprising:
an output control circuit coupled to the inverter circuit, the output control circuit being controlled by an output control signal, wherein the first voltage having a DC level is output as the emission signal when the output control signal having a logic low level is applied to the output control circuit.

14. An emission driver comprising:
a first emission driving unit configured to receive a frame line mark (FLM) signal as an input signal, and to output a first emission signal and a first sequential input signal, the first emission driving unit being controlled by a first clock signal and a second clock signal; and
second through (n)th emission driving units, where n is an integer greater than or equal to 3, configured to output second through (n)th emission signals, respectively, the second through (n)th emission driving units being controlled by the first clock signal and the second clock signal,
wherein the first through (n−1)th emission driving units sequentially provide the first sequential input signal and second through (n−1)th sequential input signals as the input signal to the second through (n)th emission driving units, respectively, and
wherein each of the first through (n)th emission driving units includes:
an input signal generating circuit configured to receive the input signal according to the first clock signal, to receive the second clock signal according to the input signal, and to output one of the first through (n−1)th sequential input signals;
an inverter circuit configured to receive the input signal according to the first clock signal, and to invert the input signal to generate an inverter output signal according to the second clock signal different from the first clock signal; and
an output switching circuit configured to output a first voltage having a logic high level or a second voltage having a logic low level as one of the first through (n)th emission signals in response to the inverter output signal.

15. The driver of claim 14, wherein each of the first through (n)th emission driving units is implemented by transistors of the same kind.

16. The driver of claim 15, wherein the first through (n)th emission signals are substantially inverted versions of the FLM signal.

17. An organic light emitting diode display device comprising:
a display panel configured to receive a first power voltage and a second power voltage, the display panel having a plurality of pixel circuits, and each of the pixel circuits including an organic light emitting diode;
a scan driver configured to sequentially provide first through (n)th scan signals, where n is an integer greater than or equal to 3, to the pixel circuits via first through (n)th scan-lines;
a data driver configured to provide data voltages to the pixel circuits via a plurality of data-lines according to the first through (n)th scan signals;
an emission driver configured to sequentially provide first through (n)th emission signals to the pixel circuits via first through (n)th emission control-lines; and
a timing controller configured to provide a first clock signal and a second clock signal to the scan driver, the data driver, and the emission driver,
wherein the emission driver includes first through (n)th emission driving units that generate the first through (n)th emission signals, respectively,
wherein each of the first through (n)th emission driving units is controlled by the first clock signal and the second clock signal, and each of the first through (n)th emission driving units is implemented by transistors of the same kind,
wherein the first through (n)th emission driving units receive a frame line mark (FLM) signal and first through (n−1)th sequential input signals as an input signal, respectively,
wherein each of the first through (n)th emission driving units comprises an inverter circuit configured to receive the FLM signal according to the first clock signal, and to invert the FLM signal to generate an inverter output signal according to the second clock signal different from the first clock signal, and
wherein the first through (n−1)th emission driving units are configured to respectively generate and output the first through (n−1)th sequential input signals according to the corresponding inverter output signal.

18. The device of claim 17, wherein the emission driver is implemented with N-channel metal-oxide semiconductor (NMOS) transistors,
wherein a period during which the first through (n)th emission signals have a logic low level corresponds to a period during which a data programming operation is performed for the pixel circuits, and
wherein a period during which the first through (n)th emission signals have a logic high level corresponds to a period during which the organic light emitting diodes included in the pixel circuits emit light.

19. The device of claim 18, wherein the emission driver adjusts a length of a period during which the display panel displays a black image by controlling an off duty ratio of the first through (n)th emission signals.

20. The device of claim 19, wherein the organic light emitting diodes included in the pixel circuits sequentially emit light as the emission driver sequentially provides the first through (n)th emission signals to the pixel circuits.

* * * * *